United States Patent [19]

Plaster

[11] Patent Number: 4,675,058
[45] Date of Patent: Jun. 23, 1987

[54] METHOD OF MANUFACTURING A HIGH-BANDWIDTH, HIGH RADIANCE, SURFACE EMITTING LED

[75] Inventor: James L. Plaster, Garland, Tex.

[73] Assignee: Honeywell Inc., Minneapolis, Minn.

[21] Appl. No.: 783,893

[22] Filed: Oct. 3, 1985

Related U.S. Application Data

[62] Division of Ser. No. 561,501, Dec. 14, 1983, abandoned.

[51] Int. Cl.⁴ .......................................... H01L 21/208
[52] U.S. Cl. ................................ 148/171; 29/569 L; 29/576 E; 148/172; 357/17
[58] Field of Search .............. 148/171, 172; 29/569 L, 29/576 E; 357/17

[56] References Cited

U.S. PATENT DOCUMENTS

| | | | |
|---|---|---|---|
| 3,936,855 | 2/1976 | Goell et al. | 357/17 |
| 4,149,175 | 4/1979 | Inoue et al. | 148/171 X |
| 4,169,997 | 10/1979 | Logan et al. | 148/171 X |
| 4,184,171 | 1/1980 | Panish | 148/171 X |
| 4,220,960 | 9/1980 | Liu et al. | 357/17 |
| 4,249,967 | 2/1981 | Liu et al. | 148/171 |
| 4,309,670 | 1/1982 | Burnham et al. | 357/17 X |
| 4,342,944 | 8/1982 | SpringThorpe | 313/499 |
| 4,377,865 | 3/1983 | Sugino et al. | 148/171 X |
| 4,425,650 | 1/1984 | Mito et al. | 148/171 X |
| 4,426,703 | 1/1984 | Kuroda et al. | 148/171 X |

Primary Examiner—George T. Ozaki
Attorney, Agent, or Firm—John G. Shudy; John P. Sumner; Albin Medved

[57] ABSTRACT

A method of manufacturing an LED including a substrate with an elevated surface portion, an epitaxial blocking layer adjacent thereto, and a double-heterojunction structure thereover.

11 Claims, 7 Drawing Figures

METHOD OF MANUFACTURING A HIGH-BANDWIDTH, HIGH RADIANCE, SURFACE EMITTING LED

This application is a division of application Ser. No. 561,501 filed on Dec. 14, 1983, now abandoned.

The present invention relates to light emitting diodes (LED's) and more specifically to improved double heterojunction LED's.

BACKGROUND OF THE INVENTION

FIGS. 1A and 1B illustrate a typical method of manufacturing a double heterojunction LED of the prior art and the structure of such a prior art LED. Turning first to FIG. 1A, a substrate 100 of GaAs is doped to have a p+ type conductivity. On a major surface of substrate 100 an epitaxial layer 101 of GaAs, doped to have an n type conductivity, is formed. A masking layer 102 is then formed on epitaxial layer 101. Typically masking layer 102 is formed by placing a uniform layer of a photosensitive resist material on epitaxial layer 101. Photoresist 102 may then be exposed and developed leaving the resist material covering those regions of epitaxial layer 101 to be retained while leaving exposed those regions of epitaxial layer 101 which are to be removed by etching. The assembly is then subjected to an etching step which removes unprotected portions of epitaxial layer 101. Following the etching step resist layer 102 is completely removed and the exposed surface of epitaxial layer 101 carefully cleaned to remove the resist material and the etchant.

Turning now to FIG. 1B an epitaxial layer of $Al_xGa_{1-x}As$ doped to have a p type conductivity 103 is formed on the exposed surface of n type epitaxial layer 10. When epitaxial layer 103 is grown the gap formed in epitaxial layer 101 by etching will be filled creating p type region 104. The upper surface 105 of epitaxial layer 103 will be substantially, but not completely, planar. In particular, in the region directly over region 104 a small depression will exist due to incomplete filling of region 104.

Another p type epitaxial layer 106 $Al_xGa_{1-x}As$ is then formed on surface 105 of epitaxial layer 103. Epitaxial layer 106 will form the active layer of the LED when construction of the LED is completed. In particular, region 107, indicated by crosshatching, forms the active region of the device. The crosshatching is intended to show where the recombination, and thus light production, will take place, but does not indicate any difference in doping levels between the active region 107 and the rest of active layer 106.

An n type epitaxial layer 108 of $Al_xGa_{1-x}As$ is formed over layer 107. An n type epitaxial layer 109 of GaAs is formed over layer 108. A portion of epitaxial layer 109 directly over active region 107 is etched away, resulting in window 109, in order to allow light produced in active region 107 to escape.

In operation, epitaxial layer 109 serves as a capping layer and is primarily provided to allow good electrical contact with other circuitry. Epitaxial layers 108 and 103 each serve as confining layers, meaning that they tend to hold charge carriers in active layer 106 until recombination occurs. Epitaxial layer 106 acts as the active layer as described above. Epitaxial layer 101 is commonly known as a blocking layer because, during normal operation of the device, a reverse biased p-n junction exists between regions 101 and 103. Thus, current flowing from region 103 to substrate 100 must flow through region 104. It is this limitation of current flow to region 104 that limits the active region to region 107 of active layer 106. Substrate 100 acts to provide electrical contact to other circuitry and to provide structural integrity to the device.

The effective modulation bandwidth of the prior art LED shown in FIG. 1 is limited by the series resistance presented by regions 100 and 104 and by the minority carrier lifetime in active region 107. The minority carrier lifetime may be reduced, thus increasing the modulation bandwidth of the device, by either increasing the doping level in active region 107 or by reducing the size of active region 107. If the doping level in active region 107 is increased to too high of a level an excessive number of non-radiative centers are formed therein and the increase in modulation bandwidth is accompanied by a decrease in quantum efficiency. Therefore, a preferable way of decreasing minority carrier lifetime in active region 107, and thus increasing the modulation bandwidth of the device, would be to reduce the size of active region 107.

A second difficulty with the prior art process as described above is that both the thickness of n type epitaxial layer 101 and the etching to form region 104 must be very carefully controlled. If the etching does not form a gap all of the way through layer 101 a reverse biased p-n junction will be formed between region 104 and region 101, at worst preventing effective current flow between region 103 and region 100 and at best substantially increasing the series resistance of the device. Clearly this would prevent proper operation of the LED. Alternatively, if the well etched to form region 104 is very deep, p type epitaxial layer 103 must be very thick in order to insure that region 104 will be completely filled. If epitaxial layer 103 is thick the series resistance of the LED will be substantially increased. In order to keep the well depth as shallow as possible, layer 101 is typically in the range of two to three micron thick. Smaller dimensions for layer 101 may be insufficient to perform the required current blocking. Because etching proceeds laterally as well as vertically the minimum thickness for layer 101 tends to set a minimum width for region 104. Additionally if the aspect ratio, i.e. ratio of the height to the width, of an etched well is too great, liquid phase epitaxial growth in that well will be difficult. This phenomenon further limits the minimum width of region 104 and hence of active region 107. At the same time the fact that epitaxial layer 101 is only two to three microns thick prevents a thorough cleaning job on the surface of that region subsequent to the removal of resist mask 102 but prior to growth of subsequent epitaxial layers because cleaning could damage such a thin layer. Various contaminants left on the surface of region 101 may have a deleterious effect on the quality of epitaxial layers grown thereon.

SUMMARY OF THE INVENTION

In the present invention a first major surface of a substrate of semiconductor material, preferably GaAs, is etched so that the substrate is reduced in thickness in all but one or more selected portions. After the etching, the selected portions may be considered to be elevated regions with respect to the remainder of the new surface of the substrate. In a preferred embodiment each selected portion is circular in shape. A semiconductor layer, preferably GaAs, is produced by epitaxial growth techniques on the new surface produced by the etching.

The surface of this epitaxial layer should be at the same level as or slightly higher than the level of the elevated portions. A small portion of the epitaxial layer is removed, either by etching or by melt back, so that the surfaces of the elevated portions are exposed. A series of epitaxial layers of semiconductor material, preferably $Al_xGa_{1-x}As$, are then grown to form a double heterojunction structure. The value of x will commonly vary from layer to layer. Typically a GaAs capping layer is then added to help improve electrical contact.

DETAILED DESCRIPTION OF THE PREFERRED EMBODIMENTS

Those skilled in the art will realize that LED's such as the LED of the invention are typically produced in arrays with a plurality of such LED's being produced on a single semiconductor substrate. Each individual LED is produced simultaneously using the same process, however, so the process of the present invention will be described with respect to only a single LED.

Figure 3:
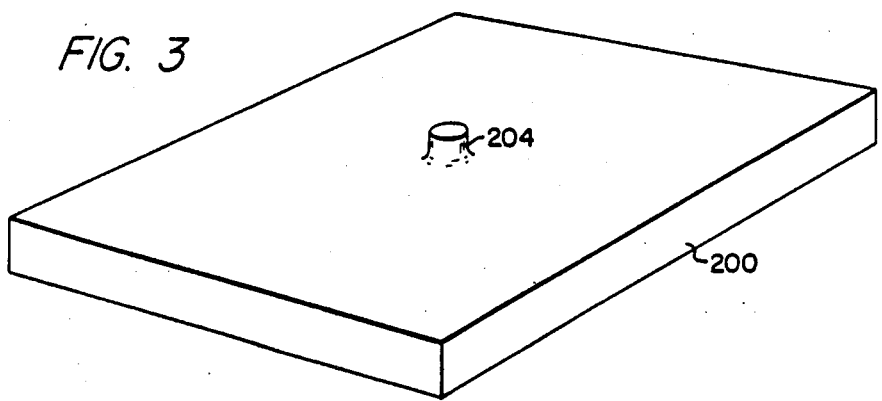
FIG. 3 is a perspective view of a semiconductor substrate with an elevated portion such as would be formed during the processing of an LED of the invention.
Figure 2A:
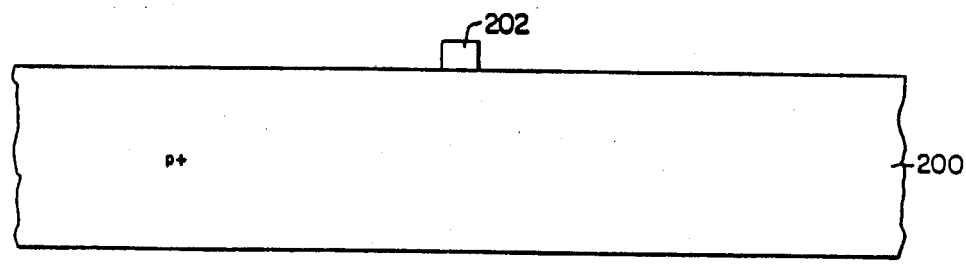
FIGS. 2A, 2B, 2C, and 2D illustrate the process of making the LED of the invention and the LED thus manufactured.

Turning now to FIG. 2A, a semiconductor substrate 200, preferably of GaAs doped to have p+ type conductivity, has an etching mask 202 thereon. Typically the etching mask is a developed photosensitive resist material. The substrate is then subjected to an etching process which reduces the height of the substrate in all areas other than those protected by the etching mask. The etching mask is then removed and the surface of the substrate is thoroughly cleaned. The effect of the etching process is to leave a primary surface portion in those regions of the substrate where etching occurred and elevated surface portions in those regions of the substrate protected by the etching mask. Preferably these elevated portions are circular in shape. FIG. 3 illustrates substrate 200 with elevated portion 204, following the etching process and removal of the etching mask.

Figure 2B:
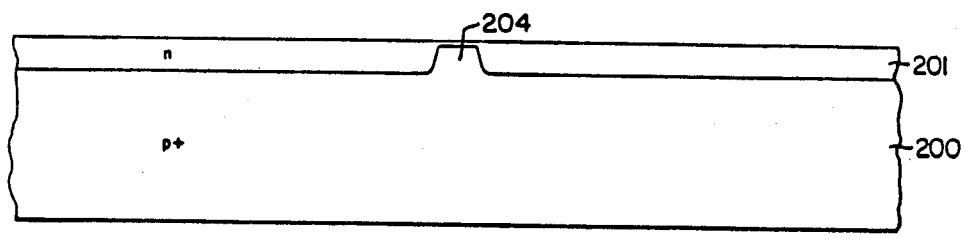
Figure 2C:
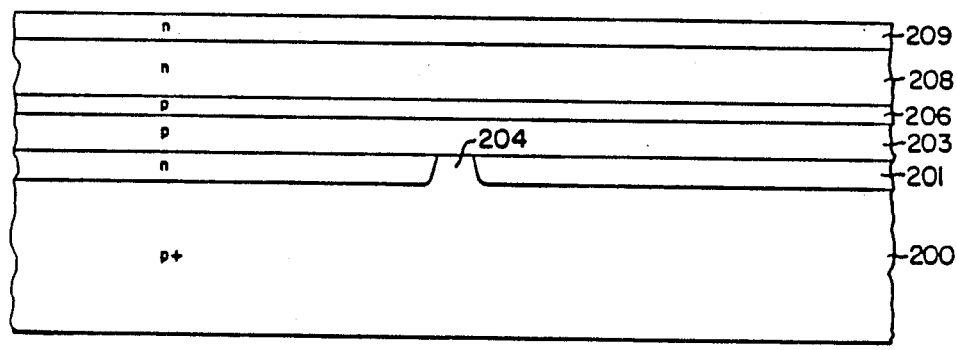

As shown in FIG. 2B an epitaxial layer 201 of semiconductor material, preferably GaAs doped to have n type conductivity, is then grown on the surface formed by the etching process. Preferably epitaxial layer 201 is grown by known techniques of liquid phase epitaxy. As shown in FIG. 2B epitaxial layer 201 slightly covers the top of elevated portion 204. Preferably epitaxial layer 201 extends approximately 0.1 μm over elevated portion 204.

Following the growth of epitaxial layer 201 the surface thereof is subjected to an etching process in order to expose elevated portion 204 and to produce an essentially planar surface. Typically the entire exposed surface of epitaxial layer 201 is to be etched, so no etching mask is required. After the etching the surface thus produced is thoroughly cleaned to remove all contaminants from the etching process. When the surface is sufficiently cleaned, epitaxial layer 203, preferably of $Al_{0.2}Ga_{0.8}As$ doped to have p type conductivity, is grown thereon. Next the active layer, p type epitaxial layer 206, is grown on epitaxial layer 203. Preferably active layer 206 is of $Al_{0.025}Ga_{0.975}As$. An n type epitaxial confining layer 208, preferably of $Al_{0.2}Ga_{0.8}As$, is next grown, followed by the growth of n type epitaxial capping layer 209 of GaAs. Each of layers 203, 206, 208, and 209 are preferably grown by known techniques of liquid phase epitaxy. Although the compositions described above are preferred, those skilled in the art will perceive that a variation in the aluminum to gallium ratio will not prevent operation of the device, but will merely shift the frequency of emitted radiation. Furthermore other III-V semiconductor materials may be used within the scope of the invention.

Figure 1A:
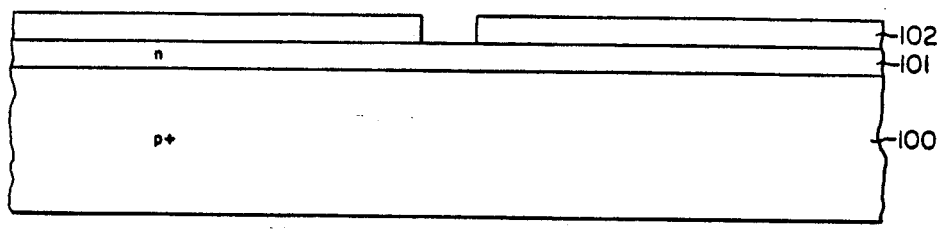
FIGS. 1A and 1B show a prior art process for making a double heterojunction LED and a cross-section of the LED thus manufactured.
Figure 1B:
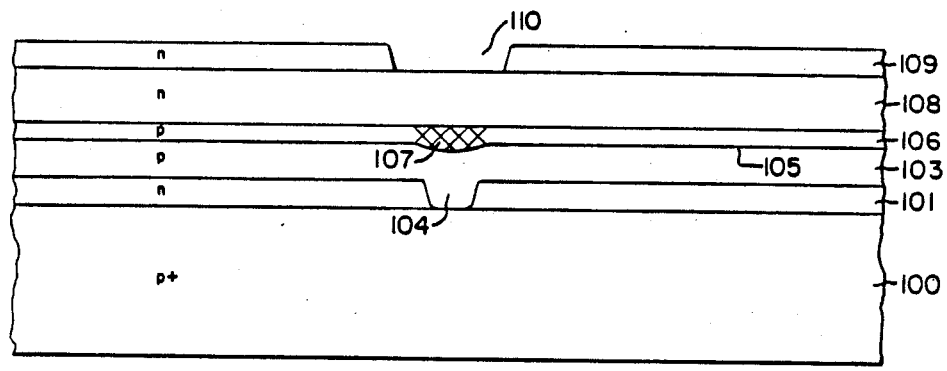
Figure 2D:
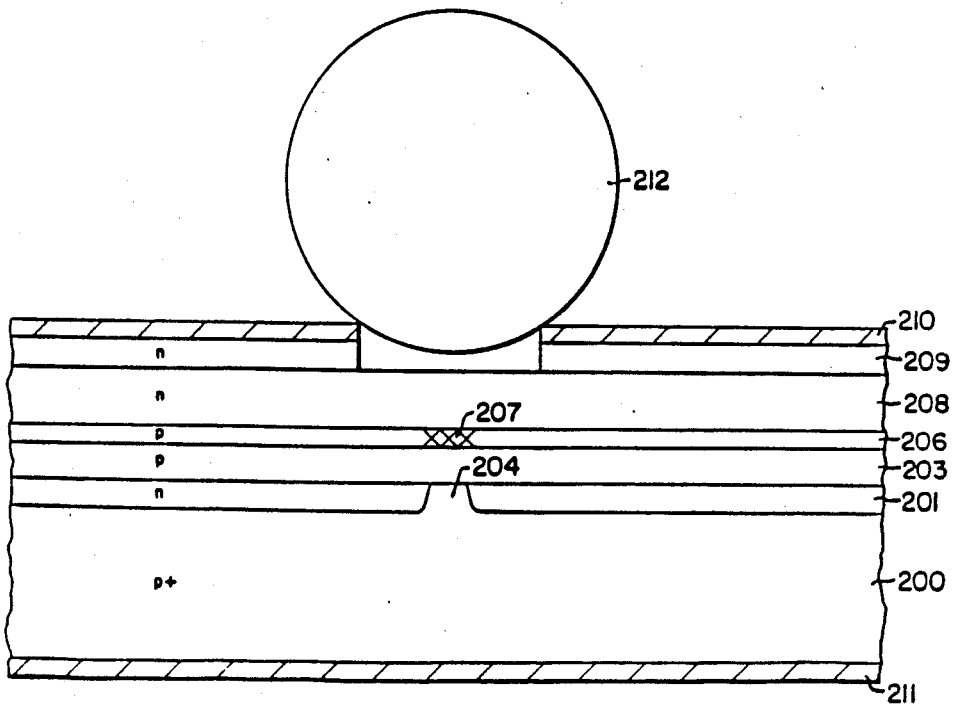

FIG. 2D illustrates a completed LED of the invention. Epitaxial capping layer 209 is etched to form a gap overlying elevated region 204. Metallic electrical contact areas 210 and 211 are formed on capping layer 209 and substrate 200 respectively. Finally, spherical microlens 212 is attached to the device as shown. As in the prior art LED of FIG. 1B active region 207 of the LED of FIG. 2D is indicated by crosshatching. Again, as in FIG. 1B, this crosshatching does not indicate any difference in the composition or the doping level of region 207, as compared with the rest of active layer 206, but merely indicates that this is the area where recombination occurs and light is emitted.

The LED of the invention provides numerous advantages as compared with the prior art LED's for several reasons. Because elevated region 204 is of the substrate material, which is more heavily doped than the material forming region 104 of FIG. 1B, a lower series resistance is provided. Second, after each etching step a more thorough cleaning process may be performed without fear of entirely removing a necessary layer, thereby reducing contamination and dislocations in the subsequently grown epitaxial layers. Third, the size of active region 207 may be reduced in both the lateral and transverse dimensions as compared with active region 107 of the LED of FIG. 1B. In FIGS. 1A, 1B, 2A, 2B, 2C and 2D, lateral dimensions refer to horizontal distances and transverse dimensions refer to vertical distances. In the transverse dimension it may be reduced in size because epitaxial layer 206 is grown on a planar surface rather than a surface with a slight well as in the prior art. In the lateral dimension the size may be reduced because the lateral dimension of region 204 may be made smaller than the comparable lateral dimension of region 104 of the device of FIG. 1B. Therefore, the modulation bandwidth of the device may be increased both due to decreased series resistance of the device and due to a reduced size active region. At the same time the improved cleaning provides a greater reliability in the manufacturing process. In an alternative embodiment of the manufacturing process described above elevated region 204 is prepared as it was previously. Epitaxial region 201 is then grown, forming the structure shown in FIG. 2B. Rather than etching epitaxial layer 201 to expose elevated region 204, however, the surface of layer 201 is immersed in a GaAs melt which is slightly undersaturated with As. Such immersion will melt back a portion of epitaxial layer 201 in order to expose region 204. Thus when layer 203 is grown an electrical contact will be formed between epitaxial layer 203 and region 204. The processing then proceeds exactly as before to form the final structure of FIG. 2D.

This alternative procedure provides the advantage that the processing may continue uninterrupted by the etching step thereby decreasing the number of process steps required. Furthermore, there is no possibility of etching contaminants being introduced into the system due to the etching of layer 201 because no such etching occurs. Finally, atmospheric contamination is also reduced because the device need not be removed from the epitaxial growth chamber and exposed to the atmosphere between epitaxial growth steps.

I claim:

1. A method of manufacturing a double heterojunction light emitting diode, said method comprising the steps of:

etching a first major surface of a semiconductor substrate having a first conductivity type so as to form a primary surface portion and an elevated surface portion resulting in a mesa formation;

forming a substantially planar surface by growing a first epitaxial layer of a second conductivity type by liquid phase epitaxy;

exposing said substrate elevated portion through etching resulting in an essentially overall planar surface in conjunction with said first epitaxial layer;

growing a second epitaxial layer of semiconductor material of said first conductivity type on said substantially planar surface;

growing a third epitaxial layer of a semiconductor material of said first conductivity type on said second epitaxial layer;

growing a fourth epitaxial layer of a semiconductor material of said second conductivity type on said third epitaxial layer; and growing a fifth epitaxial layer of a semiconductor material of said second conductivity type of said fourth epitaxial layer.

2. The method of claim 1 wherein said step of forming said substantially planar surface includes the steps of:

growing said first epitaxial layer on said substrate primary surface portion, said first epitaxial layer being grown to a height such that said semiconductor substrate elevated surface portion is covered; and etching said first epitaxial layer to form said substantially planar surface.

3. The method of claim 2 wherein said first conductivity type is p type and said second conductivity type is n type.

4. The method of claim 2 wherein said substrate, said first epitaxial layer, and said fifth epitaxial layer each comprise GaAs, and said second epitaxial layer, said third epitaxial layer, and said fourth epitaxial layer each comprise $Al_xGa_{1-x}As$.

5. The method of claim 4 wherein said second epitaxial layer and said fourth epitaxial layer comprise $Al_{0.2}Ga_{0.8}As$ and said third epitaxial layer comprises $Al_{0.025}Ga_{0.975}As$.

6. The method of claim 5 wherein each of said epitaxial layers is formed by means of liquid phase epitaxy.

7. The method of claim 1 wherein said step of forming said substantially planar surface includes the steps of:

growing said first epitaxial layer on said substrate primary surface portion, said first epitaxial layer being grown to a height such that said semiconductor substrate elevated surface portion is covered; and melting back said first epitaxial layer in order to expose said elevated surface portion and to form said substantially planar surface, said melting back being accomplished by immersing at least a portion of said first epitaxial layer in a GaAs melt, said melt being undersaturated with As.

8. The method of claim 7 wherein said first conductivity type is p type and said second conductivity type is n type.

9. The method of claim 8 wherein said substrate, said first epitaxial layer, and said fifth epitaxial layer each comprise GaAs, and said second epitaxial layer, said third epitaxial layer, and said fourth epitaxial layer each comprise $Al_xGa_{1-x}As$.

10. The method of claim 9 wherein said second epitaxial layer and said fourth epitaxial layer comprise $Al_{0.2}Ga_{0.8}As$ and said third epitaxial layer comprise $Al_{0.025}Ga_{0.975}As$.

11. The method of claim 10 wherein each of said epitaxial laayers is formed by means of liquid phase epitaxy.

* * * * *

UNITED STATES PATENT AND TRADEMARK OFFICE
CERTIFICATE OF CORRECTION

PATENT NO. : 4,675,058
DATED : June 23, 1987
INVENTOR(S) : James L. Plaster

It is certified that error appears in the above-identified patent and that said Letters Patent is hereby corrected as shown below:

Column 6, lines 10-12, cancel "$Al_{0.2}Ga_{0.8}As$ and said third epitaxial layer comprises $Al_{0.025}Ga_{0.975}As$." and substitute --$Al_{.2}Ga_{.8}As$ and said third epitaxial layer comprises $Al_{.025}Ga_{.975}As$.--.

Column 6, lines 39 and 40, cancel "$Al_{0.2}Ga_{0.8}As$ and said third epitaxial layer comprise $Al_{0.025}Ga_{0.975}As$." and substitute -- $Al_{.2}Ga_{.8}As$ and said third epitaxial layer comprise $Al_{.025}Ga_{.975}As$.--.

Column 6, line 42, cancel "laayers" and substitute --layers--.

Signed and Sealed this

Third Day of November, 1987

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,675,058
DATED : June 23, 1987
INVENTOR(S) : James L. Plaster

It is certified that error appears in the above-indentified patent and that said Letters Patent is hereby corrected as shown below:

Column 5, line 33, delete "type of" and substitute therefore --type on--.

Signed and Sealed this

Fourth Day of March, 1997

Attest:

BRUCE LEHMAN

*Attesting Officer*  *Commissioner of Patents and Trademarks*